United States Patent

Arai

(10) Patent No.: US 7,623,398 B2
(45) Date of Patent: Nov. 24, 2009

(54) SEMICONDUCTOR MEMORY DEVICE AND SEMICONDUCTOR DEVICE

(75) Inventor: Minari Arai, Tokyo (JP)

(73) Assignee: Elpida Memory, Inc, Tokyo (JP)

( * ) Notice: Subject to any disclaimer, the term of this patent is extended or adjusted under 35 U.S.C. 154(b) by 261 days.

(21) Appl. No.: 11/849,379

(22) Filed: Sep. 4, 2007

(65) Prior Publication Data
US 2008/0054965 A1    Mar. 6, 2008

(30) Foreign Application Priority Data
Sep. 5, 2006    (JP)    ............................ 2006-240474

(51) Int. Cl.
*G11C 7/00*    (2006.01)

(52) U.S. Cl. ............... 365/194; 365/233.1; 365/233.12; 365/63; 327/141; 327/158

(58) Field of Classification Search ................. 365/194, 365/233.1, 233.12, 63; 327/141, 158
See application file for complete search history.

(56) References Cited

U.S. PATENT DOCUMENTS

| 5,949,139 | A | 9/1999 | Imura et al. | |
|---|---|---|---|---|
| 6,078,514 | A * | 6/2000 | Takemae et al. | ............... 365/63 |
| 6,205,082 | B1 | 3/2001 | Tomita et al. | |
| 6,618,320 | B2 | 9/2003 | Hasegawa et al. | |
| 6,819,608 | B2 * | 11/2004 | Watanabe | ................... 365/200 |
| 7,429,794 | B2 | 9/2008 | Ryu et al. | |
| 7,464,225 | B2 * | 12/2008 | Tsern | ........................ 711/115 |
| 2003/0221044 | A1 * | 11/2003 | Nishio et al. | ................... 711/4 |
| 2005/0206416 | A1 * | 9/2005 | Kizer | ........................ 327/156 |
| 2005/0280165 | A1 | 12/2005 | Ryu et al. | |

FOREIGN PATENT DOCUMENTS

| JP | 11/008346 | 1/1999 |
|---|---|---|
| JP | 11/086546 | 3/1999 |
| JP | 11-340421 | 12/1999 |
| JP | 2002-015567 | 1/2002 |
| JP | 2002-318638 | 10/2002 |
| JP | 2005-228932 | 5/2005 |
| JP | 2006-013495 | 1/2006 |

OTHER PUBLICATIONS

Japanese Patent Office issued a Japanese Office Action dated Mar. 9, 2009, Application No. 2006-240474.

* cited by examiner

*Primary Examiner*—Pho M Luu
*Assistant Examiner*—Toan Le
(74) *Attorney, Agent, or Firm*—Young & Thompson

(57) ABSTRACT

Disclosed is a module where semiconductor memory devices each having a DLL (Delay Lock Loop) are stacked or a multi-chip module (MCM) having the semiconductor memory devices, a dedicated pad for sharing a clock signal between one of the semiconductor memory devices and other semiconductor memory device is included. The clock signal is delay adjusted by the DLL. The DLL in the one semiconductor memory device is operated, while the DLL in the other semiconductor memory device is not operated. A flying lock clock signal synchronized with an external differential clock signal and generated from a clock signal delay adjusted by the DLL is output from the dedicated pad of the one semiconductor memory device. The other semiconductor memory device receives the flying lock clock signal from the dedicated pad.

19 Claims, 9 Drawing Sheets

SEMICONDUCTOR MEMORY DEVICE AND SEMICONDUCTOR DEVICE

REFERENCE TO RELATED APPLICATION

The present application is claiming the priority of the earlier Japanese patent application No. 2006-240474 filed on Sep. 5, 2006, the entire disclosure thereof being incorporated herein by reference thereto.

FIELD OF THE INVENTION

The present invention relates to a semiconductor device. More specifically, the invention relates to a clock-synchronized type semiconductor memory device.

BACKGROUND OF THE INVENTION

In recent years, DLL (Delay Lock Loop) circuits have been in wide spread use for delay-synchronization in semiconductor devices such as clock-synchronized type semiconductor memory devices. In modules, current consumption of DLLs corresponding to the number of semiconductor memory devices with DLLs mounted thereon are further required. This has become a factor that increases power consumption as a system.

SUMMARY OF THE DISCLOSURE

The following analysis is given by the present invention.

A temperature rise (heat generation) caused by an increase in current consumption leads to instability of the system. Thus, less current consumption is preferable.

Accordingly, an object of the present invention is to provide a semiconductor memory device and a semiconductor device including a plurality of chips of semiconductor memory devices each having a DLL circuit, in which power consumptions of DLL circuits are reduced.

The invention disclosed in this application is generally configured as follows:

In one aspect of the present invention, there is provided a semiconductor memory device including: a DLL (Delay Lock Loop) circuit; and at least one pad for supplying to at least one other semiconductor memory device a clock signal (referred to as a "flying lock clock signal") delay-synchronized with an external clock signal, the clock signal being generated from a locked clock in the DLL circuit.

In another aspect of the present invention, there is provided a semiconductor memory device including: a DLL (Delay Lock Loop) circuit; and a pad that receives a clock signal (referred to as a "flying lock clock signal") delay-synchronized with an external clock signal, the clock signal being generated from a locked clock in a DLL circuit of other semiconductor memory device and supplied from the other semiconductor memory device.

In another aspect of the present invention, there is provided a semiconductor memory device including: a DLL (Delay Lock Loop) circuit; and a pad that supplies to at least one other semiconductor memory device a clock signal (referred to as a "flying lock clock signal") generated from a locked clock in the DLL circuit and delay-synchronized with an external clock signal, or receives the flying lock clock signal supplied from a DLL circuit of the other semiconductor memory device.

In the semiconductor memory device according to the present invention, the DLL circuit of the semiconductor memory device that receives the flying lock clock signal supplied from the DLL circuit of the other semiconductor memory device is deactivated, and the deactivated DLL circuit receives the flying lock clock signal supplied to the dedicated pad and supplies the received flying lock clock signal to an internal circuit as a lock signal of the DLL circuit.

In the semiconductor memory device according to the present invention, selection can be made between a state where the flying lock clock signal is supplied to the other semiconductor memory device via a pad of the other semiconductor memory device connected to the pad by a bonding wire and a state where the flying lock clock signal is supplied from the other semiconductor memory device via the pad connected to the pad of the other semiconductor memory device by the bonding wire.

In the semiconductor memory device according to the present invention, information on a delay caused by connection via pads connecting the semiconductor memory device and the other semiconductor memory device may be obtained by a replica circuit using resistors and capacitors, and a clock signal advanced with respect to the clock signal locked by the DLL circuit by the delay may be supplied to the other semiconductor memory device as the flying lock clock signal.

In the semiconductor memory device according to the present invention, the DLL circuit may output other clock signal (ELCLK) delay-synchronized with the external clock signal from the DLL circuit, for input to a first input terminal (MLCLK) of the DLL circuit from one pad via other pad connected to the one pad by a bonding wire; the DLL circuit may receive the flying lock clock signal supplied from the other semiconductor memory device at a second input/output terminal (LIOCLK) of the DLL circuit through the pad via a wire, or outputs the flying lock clock signal generated at the DLL circuit and delay-synchronized with the external clock signal to the pad via the wire; and the DLL circuit may include: a lock clock select circuit that receives a DLL enable signal which controls activation of a DLL, selects a clock signal supplied to the first terminal, for output as a lock signal (LCLK) from the DLL circuit and outputs the flying lock clock signal delay-synchronized with the external clock signal to the pad from the second output terminal of the DLL circuit when the DLL enable signal is activated, and causes an output of the second terminal to be in a high-impedance state and selects the flying lock clock signal supplied to the second terminal, for output as the lock signal (LCLK) from the DLL circuit when the DLL enable signal is deactivated.

In the semiconductor memory device according to the present invention, a delay time from output of the other clock signal (ELCLK) delay-synchronized with the external clock signal from the DLL circuit, the other clock signal (ELCLK) reaching the one pad via a wire and propagating from the one pad to other pad connected to the one pad by the bonding wire, to input of the other clock signal (ELCLK) to said first terminal (MLCLK) of the DLL circuit via a wire, is made equal to a delay time from output of the flying lock clock signal delay-synchronized with the external clock signal from said second terminal (LIOCLK) of the DLL circuit, the flying lock clock signal reaching a pad of the other semiconductor device via a wire, said pad, and a bonding wire, to input of the flying lock clock signal to a second terminal (LIOCLK) of the other semiconductor device via a wire.

In the semiconductor memory device according to the present invention, preferably, a delay time from input of the other clock signal (ELCLK) delay-synchronized with the external clock signal to the lock clock select circuit to output of the lock signal (LCLK) of the DLL circuit is made equal to a delay time from input of the other clock signal (ELCLK) delay-synchronized with the external clock signal to the lock clock select circuit to output of a lock signal (LCLK) of the DLL circuit of the other semiconductor device, the DLL enable signal of which is deactivated.

The semiconductor memory device according to the present invention may include: a replica delay element of wire, pad, and bonding wire portions that replicates a delay from output of the other clock signal (ELCLK) from the DLL circuit to input to the first terminal (MLCLK) of the DLL circuit from one pad via other pad connected to the other pad by a bonding wire.

In the semiconductor memory device according to the present invention, the DLL circuit receives a clock signal at an input terminal (LICLK) of the DLL circuit via the pad for a clock signal to be supplied to the other semiconductor memory device and delay-synchronized with the external clock signal and other pad connected to said pad by a bonding wire and outputs the clock signal as a lock signal (LCLK) from the DLL circuit; and a delay time from input of other clock signal (ELCLK) delay-synchronized with the external clock signal to the lock clock select circuit of the DLL circuit to output of the lock signal (LCLK) of the DLL circuit is made equal to a delay from input of the other clock signal (ELCLK) delay-synchronized with the external clock signal to said lock clock select circuit to output of a lock signal (LCLK) of the other semiconductor devices with a DLL enable signal thereof being deactivated.

In the semiconductor memory device according to the present invention, the DLL circuit may include: a phase detection circuit that receives a clock signal from the lock clock select circuit directly or through an output circuit replica circuit, and detects a phase difference of the clock signal from the external clock signal; a delay control circuit that receives an output of the phase detection circuit and generates a signal that controls a delay time; and a delay generation circuit that changes a delay of the external clock signal according to a signal output from the delay control circuit. An output of the delay generation circuit may be input to the lock clock select circuit.

In a semiconductor device configured to be a stacked module or a multi-chip module, the stacked module including semiconductor memory devices each including a DLL (Delay Lock Loop) circuit that delay synchronizes a clock signal, the multi-chip module including the semiconductor memory devices, a synchronization circuit in one of the semiconductor memory devices is activated, and the clock signal (referred to as a "flying lock clock signal") generated from the locked DLL circuit and delay-synchronized with an external clock signal is supplied to at least one of the other semiconductor memory devices with the DLL circuit thereof deactivated, thereby allowing reduction of the number of activation of the DLL circuits with respect to the number of the mounted semiconductor memory devices and reduction of current consumption of the entire module.

In a semiconductor device configured to be a stacked module or a multi-chip module, the stacked module including semiconductor memory devices each including a DLL (Delay Lock Loop) circuit, the multi-chip module including the semiconductor memory devices, a dedicated pad for the DLL circuit for sharing a clock signal (referred to as a "flying lock clock signal") between one of the semiconductor memory devices and the other of the semiconductor memory devices is included, the flying lock clock signal being delay adjusted by the DLL circuit and delay-synchronized with an external clock signal; the DLL circuit of the one semiconductor memory device is selectively activated; the DLL circuit of the other semiconductor memory device is selectively deactivated; the flying lock clock signal generated at the DLL circuit is output from the pad of the one semiconductor memory device; and the other semiconductor memory device receives the flying lock clock signal from the pad, and the deactivated DLL circuit of the other semiconductor memory device uses the received flying lock clock signal and supplies the flying lock clock signal to an inside of the other semiconductor memory device as a lock signal.

The meritorious effects of the present invention are summarized as follows.

According to the present invention, most of the DLL circuits on chips to which the flying lock clock signals are supplied from a chip where the DLL circuit is operating do not operate. Thus, current consumptions of the DLL circuits can be reduced. As a result, current consumption of the entire module can be reduced.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

In order to describe the present invention described above in further detail, a description will be given below with reference to appended drawings. In a stacked module wherein semiconductor memory devices with DLL (Delay Lock Loop) circuits are stacked, or in a multi-chip module (MCM)

having the semiconductor memory devices with DLL circuits, there is provided a dedicated pad (PAD) for sharing a clock signal (CLK) having delay adjusted by a DLL between one of the semiconductor memory devices and other semiconductor memory device. The DLL in the one semiconductor memory device is operated, while the DLL in the other semiconductor memory device is not operated. A flying lock clock signal which is delay-synchronized with an external clock signal (such as a differential clock CLK, CLKB) and generated from a clock signal delay adjusted by the DLL is output from the dedicated pad of the one semiconductor memory device. The other semiconductor memory device receives the flying lock clock signal from the dedicated pad. Most of DLL circuits on chips to which the flying lock clock signals are supplied from a chip where the DLL circuit is operating do not operate. Thus, current consumptions of the DLL circuits can be reduced. As a result, current consumption of the entire module can be reduced. A description will be given below in connection with examples.

EXAMPLES

Figure 1:
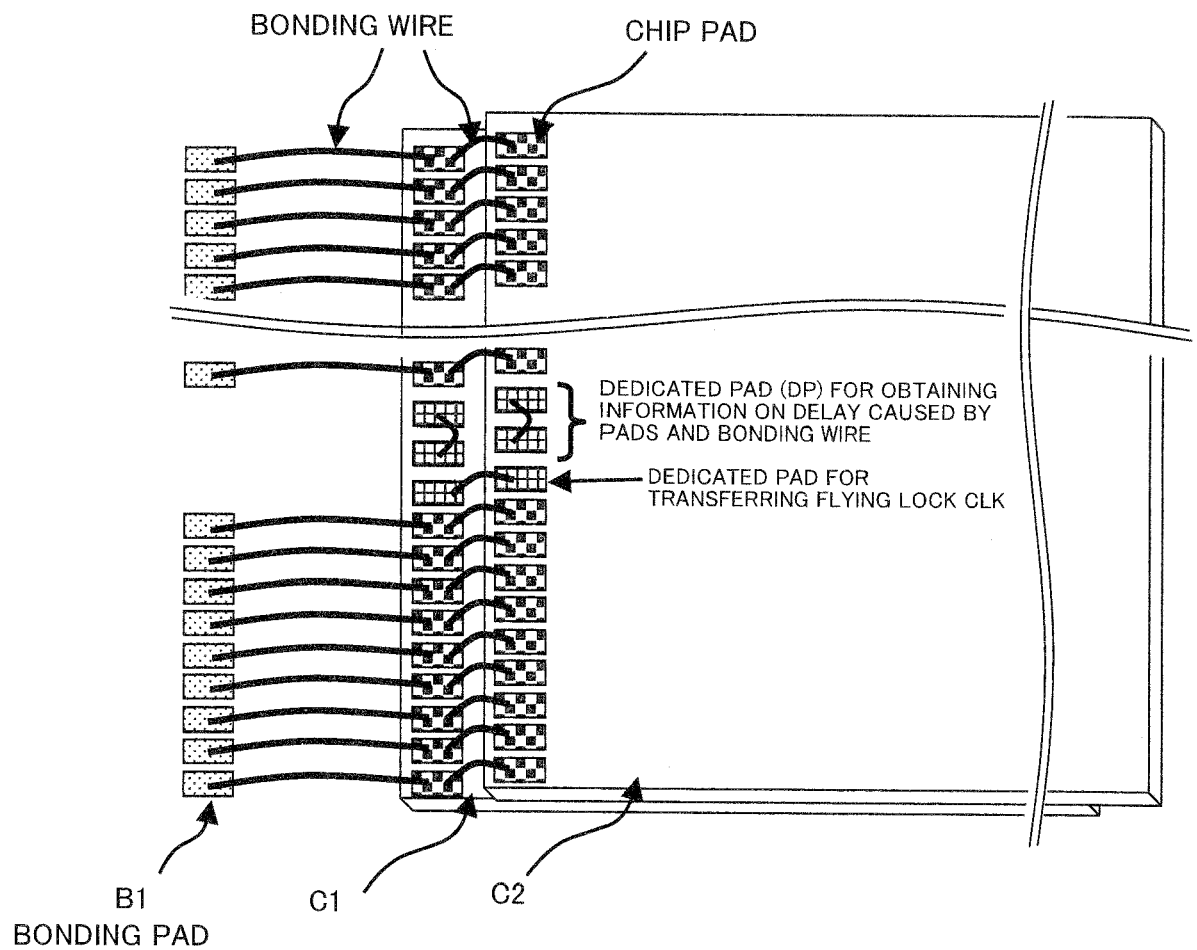
FIG. 1 is a diagram showing a bonding state when two of chips are stacked in a first example of the present invention.
Figure 2:
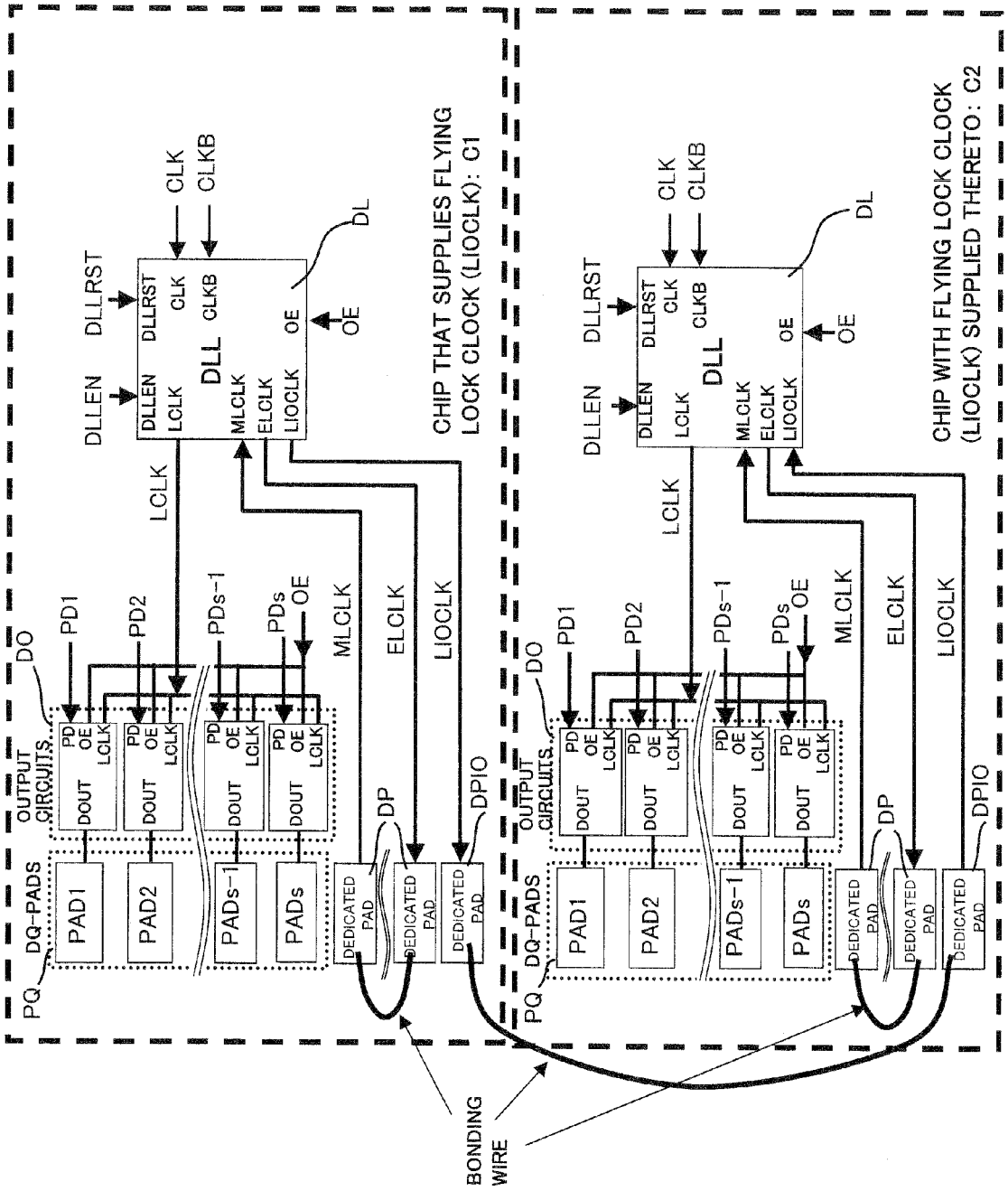
FIG. 2 is a diagram showing connection configurations between each of semiconductor memory devices and dedicated pads in the first example of the present invention.

FIGS. 1 and 2 are diagrams showing a configuration of an example of the present invention. FIG. 1 shows a bonding state when two chips of semiconductor memory devices each including dedicated pads for a DLL are stacked. FIG. 2 is a diagram for explaining an internal configuration and an operation of a semiconductor memory device including a dedicated pad (DPIO) for transferring a flying lock clock signal generated from a locked clock signal of the DLL and delay-synchronized with an external differential clock signal (CLK, CLKB).

Referring to FIG. 2, a chip C1 and a chip C2 are provided in a stacked module. The chip C1 is set so that a flying lock clock (LIOCLK) is supplied to other chip via the dedicated pad (dedicated PAD) by initial setting in accordance with an external command such as a mode register set command or using a signal from a bonding option pad (PAD) provided separately. The chip C2 is set so that the flying lock clock (LIOCLK) is captured from outside.

Each of the chips C1 and C2 includes a DLL circuit DL, output circuits DO, DQ-pads PQ, dedicated pads DP, and a dedicated pad DPIO.

Though no particular limitation is imposed, the DLL circuit DL in this example receives a differential clock signal CLK and CLKB, an output enable signal OE, a DLL enable signal DLLEN, a DLL reset signal DLLRST, and a signal MLCLK as input signals. The DLL circuit DL outputs signals LCLK and ELCLK as output signals, receives/outputs the flying lock clock (LIOCLK) as an input/output signal, and generates a timing signal for data output.

The differential clock signal CLK and CLKB is a reference clock signal differentially input from outside.

The signal DLLEN is the signal that selects whether to activate or deactivate the DLL set by an external mode register or the like.

The signal DLLRST is the signal for resetting an operation of the DLL set by the external mode register or the like.

The signal OE is an output enable signal for enabling the data output.

The signal LCLK is a clock used for the data output.

The signals ELCLK and MLCLK are the signals for obtaining wire delay information.

The signal LIOCLK is the signal for transferring the flying lock clock signal to other chip.

Signals PD1 to PDs are data signals for the data output.

The output circuits DO are formed by a group of output circuits, each of which outputs data. Input signals to each DO are the signals PD, OE, and LCLK, while an output signal from each DO is a signal DOUT.

The DQ-PADs (pads) PQ are the pads to which output signals of the output circuits are connected.

Each dedicated pad DP is provided in order to obtain delay information on the flying lock clock.

The dedicated pad DPIO is the pad for receiving or outputting the flying lock clock.

As information on wire connection between respective blocks, the flying lock clock signal generated from the signal locked by the DLL is input as the signal LCLK for each of the output circuits DO.

The signal DOUT, which is the output signal of each of the output circuits DO is connected to a corresponding one of the DQ-pads PQ.

The signal ELCLK, which is an output signal of the DLL circuit DL and the signal MLCLK, which is an input signal to the DLL circuit DL are connected to the dedicated pads, respectively. The two dedicated pads DP are connected via a bonding wire.

The signal LIOCLK, which is the input/output signal of the DLL circuit DL is connected to the dedicated pad DPIO. The dedicated pad DPIO of the chip C1 and the dedicated pad DPIO of the chip C2 are connected via a bonding wire.

A connection configuration of the chips in FIG. 1 shows the bonding state when the two chips of the semiconductor memory devices each having the dedicated pads for the DLL in FIG. 2 are stacked.

As shown in FIG. 1, the chip (semiconductor memory device) C1 and the chip C2 are stacked. Bonding pads B1, which are the bonding pads for connection to external signals, and chip PADs on the chips C1 and C2 are connected via bonding wires, respectively.

Each of the chips C1 and C2 includes the dedicated pad DPIO for transferring the flying lock clock, which is the clock generated from the clock signal locked by the DLL and is delay-locked with the differential clock signal CLK and CLKB input from outside and the two dedicated pads DP for obtaining the bonding wire delay information. The dedicated pads for transferring the flying lock clock are connected between the chip C1 and C2 by a bonding wire.

The dedicated pad DP for obtaining the bonding wire delay information (such as the dedicated pad to which the signal ELCLK is connected) is connected to the dedicated pad for obtaining the bonding wire delay information in the same semiconductor memory device (which is the dedicated PAD to which the signal MLCLK is connected) by the bonding wire.

Figure 3:
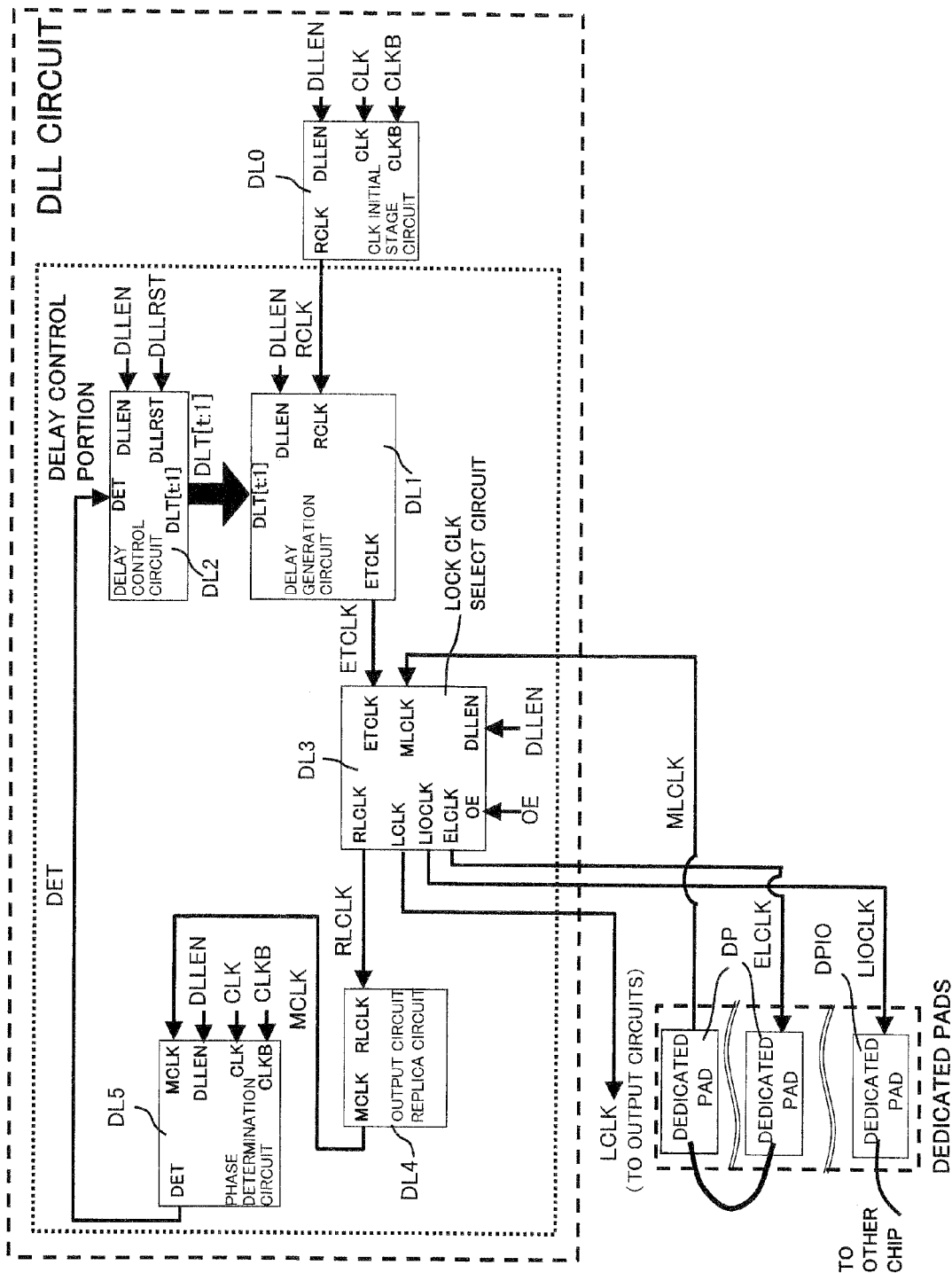
FIG. 3 is a diagram showing a configuration of a DLL circuit in the first example of the present invention and a connecting relationship between the DLL circuit and each of the dedicated pads.

FIG. 3 is a diagram showing a configuration of the DLL circuit and an example of a connecting relationship between the DLL circuit and each of the dedicated pads, in this example.

A configuration in FIG. 3 is formed of the DLL circuit and the dedicated pads. The DLL circuit includes a clock initial stage circuit DL0, a delay generation circuit DL1, a delay control circuit DL2, a lock clock select circuit DL3, an output circuit replica circuit DL4, and a phase detection circuit DL5.

The clock initial stage circuit DL0 receives and amplifies the input differential clock signal CLK and CLKB by a differential amplifier circuit which is provided in the clock initial stage circuit DL0 and includes a current mirror circuit or the like as an active load circuit, and outputs a signal RCLK.

The delay generation circuit DL1 generates a signal ETCLK obtained by adding a delay determined by DLT [t:1]

(in which t is a positive integer determined by delay adjustment accuracy) to the signal RCLK.

The delay control circuit DL2 outputs data on delay information as a DLT [t:1] signal according to a status of a signal DET, which is a phase determination result signal.

As a source signal of the clock signal LCLK to be supplied to the output circuits, the lock clock select circuit DL3 selects the signal MLCLK when the DLL is activated, and selects the signal LIOCLK when the DLL is deactivated. That is, when the DLL is deactivated, the lock clock select circuit DL3 selects the signal LIOCLK input to an LIOCLK terminal (an input/output terminal) from other chip via the dedicated pad DPIO, for output as the signal RLCLK of a LOCK signal.

When the DLL is activated, the lock clock select circuit DL3 outputs the signal RLCLK.

The output circuit replica circuit DL4 causes the signal RLCLK to have the same delay as those of the output circuits and outputs the delayed signal as the signal MCLK.

The phase detection circuit DL5 outputs a result of detection of a deviation between an edge of the signal MCLK and a cross position between the external differential clock signal CLK and CLKB, as the signal DET.

In this example, the lock clock select circuit DL3 (which is not present in a conventional configuration) is newly provided, and the output signal ETCLK of the delay generation circuit DL1 is connected to the output circuit replica circuit DL4 as the signal RLCLK.

The dedicated pads include the dedicated pads DP to which the signals MLCLK and ELCLK are connected respectively, and the dedicated pad DPIO to which the signal LIOCLK is connected. In the conventional configuration, these dedicated pads are not present.

The signal DLLEN supplied to the clock initial stage circuit DL0, delay generation circuit DL1, delay control circuit DL2, lock clock select circuit DL3, and phase detection circuit DL5 is the signal obtained by the initial setting in accordance with the external command such as the mode register set command, or from the bonding option PAD provided separately. Though no particular limitation is imposed, the signal DLLEN is set to High ("H") when the DLL is activated. When the DLL is deactivated, the signal DLLEN is set to Low ("L").

In the DLL circuit, when the signal DLLEN is Low and the DLL circuit is deactivated, an operation of each circuit that receives the signal DLLEN is stopped.

The signal DLLRST supplied to the delay control circuit DL2 is the signal for resetting delay information to an initial value.

The signal OE supplied to the lock clock select circuit DL3 is an enable signal for enabling the signal LCLK to be supplied to the output circuits.

Figure 4:
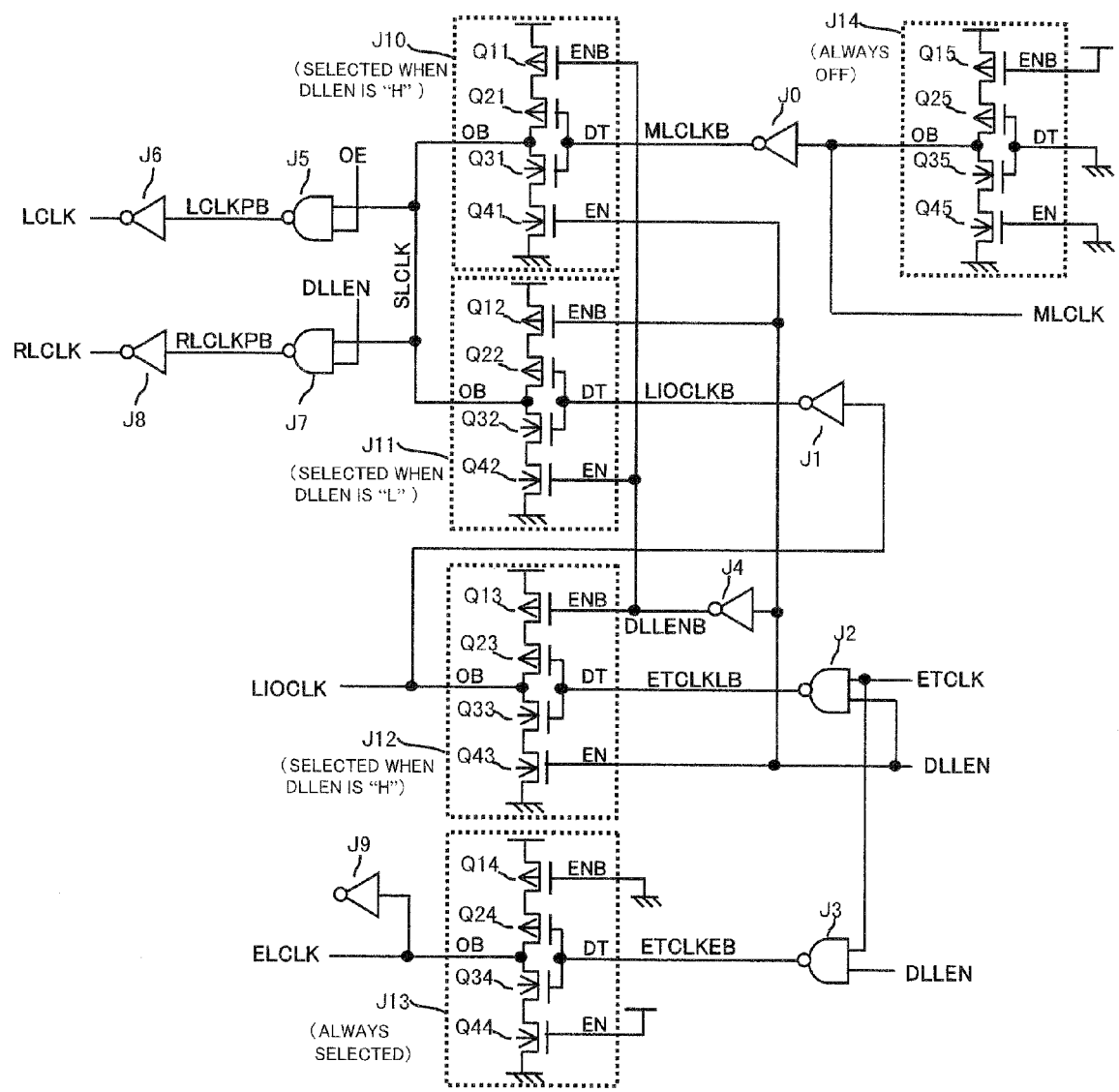
FIG. 4 is a diagram showing a configuration example of a lock clock select circuit in the first example of the present invention.

FIG. 4 is a configuration example of the lock clock select circuit DL3 in this example. The lock clock select circuit DL3 includes:

an inverter J0 that receives the signal MLCLK connected to the dedicated pad DP in FIG. 3, inverts the signal MLCLK, and outputs the inverted signal as a signal MLCLKB, an inverter J1 (an inverting receiver of the signal LIOCLK) that receives the signal LIOCLK connected to the dedicated pad DPIO in FIG. 3, inverts the signal LIOCLK, and outputs the inverted signal as a signal LIOCLKB, a two-input NAND circuit J2 that receives the signals DLLEN and ETCLK and outputs a signal ETCLKLB, a two-input NAND circuit J3 that receives the signals DLLEN and ETCLK and outputs a signal ETCLKEB, an inverter J4 that receives the signal DLLEN, inverts the signal DLLEN, and outputs a signal DLLENB, a two-input NAND circuit J5 that receives a signal SLCLK and the signal OE and outputs a signal LCLKPB, an inverter J6 that receives the signal LCLKPB, inverts the signal LCLKPB, and outputs the signal LCLK, a two-input NAND circuit J7 that receives the signals SLCLK and DLLEN and outputs a signal RLCLKPB, an inverter J8 that receives the signal RLCLKPB and outputs the signal RLCLK, an inverter J9 for load adjustment, which receives the signal ELCLK, and clocked inverter J10 to J14.

In the clocked inverter J10, the signal MLCLKB is connected as an input DT (as an input), the signal DLLENB is connected as an input ENB (which is an inverted signal of an enable signal EN), the signal DLLEN is connected as the input EN, and the signal SLCLK is connected as an output OB.

In the clocked inverter J11, the signal LIOCLKB is connected as an input DT, the signal DLLEN is connected as an input ENB, the signal DLLENB is connected as an input EN, and the signal SLCLK is connected as an output OB.

In the clocked inverter J12, the signal ETCLKLB is connected as an input DT, the signal DLLENB is connected as an input ENB, the signal DLLEN is connected as an input EN, and the signal LIOCLK is connected as an output OB (connected to the dedicated pad). The clocked inverter J12 and the NAND circuit J2 form a tri-state type non-inverting output buffer for the signal LIOCLK.

In the clocked inverter J13, the signal ETCLKEB is connected as an input DT, a ground GND is connected as ENB, a power supply is connected as an input EN, and the signal ELCLK is connected as an output OB.

In the clocked inverter J14, the ground GND is connected as DT, and the power supply is connected as an input ENB, the ground GND is connected as EN, and the signal MLCLK is connected as an output OB.

The clocked inverters J10 to J14 have the same configuration, and each of the clocked inverters J10 to J14 includes a PMOS transistor Q1I (in which I is one of integers from 1 to 5) with a source thereof connected to the power supply and a gate thereof connected to the signal ENB, a PMOS transistor Q2I (in which I is the one of the integers from 1 to 5) with a source thereof connected to a drain of the PMOS transistor Q1I (in which I is the one of the integers from 1 to 5), a gate thereof connected to the signal DT, and a drain thereof connected to the output OB, an NMOS transistor Q3I (in which I is the one of the integers from 1 to 5) with a drain thereof connected to the output OB and a gate thereof connected to the input DT, and an NMOS transistor Q4I (in which I is the one of the integers from 1 to 5) with a source thereof connected to the ground GND, a gate thereof connected to the input EN, and a drain thereof connected to a source of the NMOS transistor Q3I (in which I is the one of the integers from 1 to 5).

Figure 5:
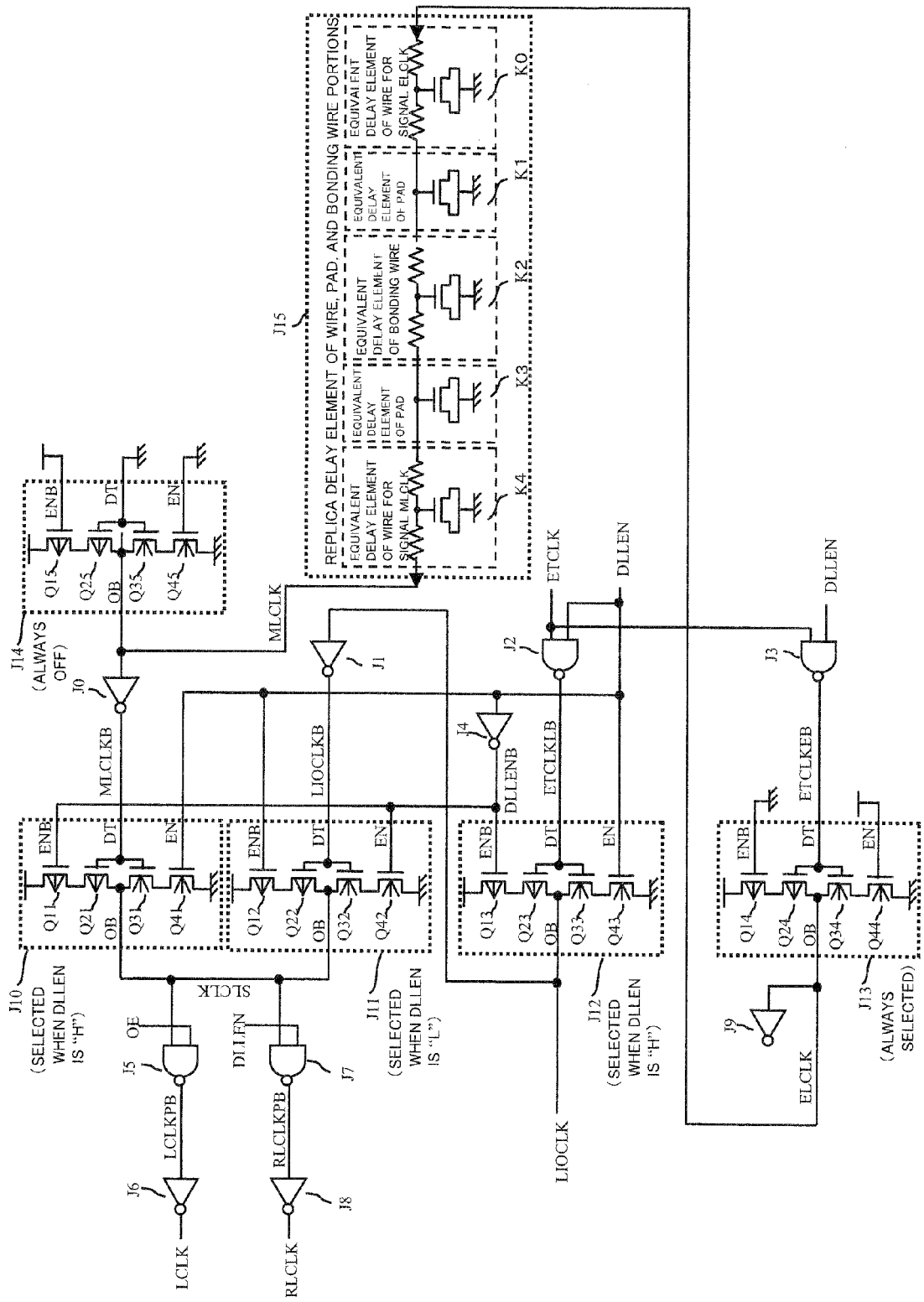
FIG. 5 is a diagram showing another configuration example of the lock clock select circuit in the first example of the present invention.

FIG. 5 is a diagram showing another configuration example of the lock clock select signal DL3 in the DLL circuit in this example. Referring to FIG. 5, on contrast with the configuration in FIG. 4, a replica delay element J15 of wire, pad, and bonding wire portions with an input thereto is the signal ELCLK and with an output therefrom is the signal MLCLK is added. Configurations of other components than this are the same as those in the configuration in FIG. 4. The replica delay element J15 is configured by connecting an equivalent delay element K0 of the signal ELCLK, an equivalent delay element K1 of the pad, an equivalent delay element K2 of the bonding wire, an equivalent delay element K3 of the pad, and an equivalent delay element K4 of a wire for the MLCLK signal are connected in series. Each of the equivalent delay elements is formed of a circuit for replicating each delay (an integration circuit formed of a resistance and an MOS capacitor).

Next, an operation of this example will be described.

Referring to FIG. 2, the chip C1 is set so that the flying lock clock is supplied to other chip C2 via the pad DPIO, by initial setting in accordance with the external command such as the mode register set command or using the signal obtained from the bonding option PAD provided separately.

Referring to the chip C2, a case where the chip C2 is set to capture the flying lock clock LIOCLK from outside is shown.

The signal DLLEN on the chip C1 is set to High, while the signal DLLEN on the chip C2 is set to Low.

The DLL circuit DL on the chip C1 on which the signal DLLEN is High in this state is activated. The DLL circuit DL performs an operation for phase synchronizing a delay of data output with the external CLK and CLKB signals, and becomes a phase-synchronized locked state.

The DLL circuit DL outputs a signal having the same phase as that of the flying lock clock LIOCLK and the same delay as that of the flying lock clock LIOCLK, as the signal ELCLK.

The signal ELCLK on the chip C1 is connected to the signal MLCLK on the dedicated pad DP via the bonding wire. The signal MLCLK is supplied to the DLL circuit DL.

On the other hand, the DLL circuit DL on the chip C2 on which the signal DLLEN is set to Low is deactivated. Then, the signal ELCLK goes Low on the DLL circuit (since the signal DLLEN is Low, an output of the NAND circuit J3 goes High at the clocked inverter J13, the transistor Q34 is turned on, and the signal ELCLK goes Low). Since the signal ELCLK is connected to the signal MLCLK via the dedicated pads DP, the signal MLCLK at a Low level is supplied to the DLL circuit DL.

The signal LIOCLK on the chip C2 is set in a high-impedance state due to the signal DLLEN (since the signal DLLEN is Low, the input EN goes Low and the signal DLLENB goes High in the clocked inverter J12. Then, the clocked inverter J12 is turned off). Since the output signal LIOCLK of the chip C1 is connected to the signal LIOCLK on the chip C2 via the dedicated pads DPIO of the chips C1 and C2. Thus, the signal LIOCLK on the chip C2 will be driven by the signal LIOCLK of the chip C1.

The above-mentioned chips connected by the bonding wires are illustrated in FIG. 1 showing the bonding state, where the two of the chips of the semiconductor memory devices each having the dedicated pads for the DLL are stacked. The dedicated pads DP are bonded within each chip, and the dedicated pads DPIO are connected between the chips.

The signals LIOCLK, MLCLK, and ELCLK within each chip are distributed with the same load so that wiring delays of the signals LIOCLK, MLCLK, and ELCLK are equal.

When a delay caused by a wiring load of the signal LIOCLK is indicated by TSL, when a delay caused by a wiring load of the signal MLCLK is indicated by TSM, and when a delay caused by a wiring load of the signal ELCLK is indicated by TSE, the following equation holds:

$$TSL=TSM=TSE \quad (1)$$

The bonding wire on each chip connecting the dedicated pads DP for obtaining bonding wire delay information, (of which a delay caused by loads of the dedicated pads DP and the bonding wire is indicated by TW1) and the bonding wire connecting the signal LIOCLK between the chips via the dedicated pads DPIO, (of which a delay caused by loads is indicated by TW2) are bonded so that delay times of the bonding wires become equal.

$$TW1=TW2 \quad (2)$$

From the foregoing conditions, it can be seen that a delay (=TSE+TW1+TSM) from output of the signal ELCLK from the DLL circuit DL on the chip C1 to input into the DLL circuit DL as the signal MLCLK via the bonding wire using the dedicated pad DP(dedicated pad DP for obtaining the bonding wire delay information) is mutually equal to a delay (=TSL+TW2+TSL) from output of the signal LIOCLK from the chip C1 to input to the DLL circuit DL on the chip C2 as the signal LIOCLK of the chip C2 via the bonding wire connecting the dedicated pad DPIO of the chip C1 and the dedicated pad DPIO of the chip C2.

That is, based on the expressions (1) and (2), the following expression holds:

$$TSE+TW1+TSM=TSL+TW2+TSL \quad (3)$$

By selecting and outputting a signal generated from the MLCLK signal as the signal LCLK on the chip C1 and by selecting and outputting a signal generated from the signal LIOCLK as the signal LCLK on the chip C2, it can be arranged that the signal LCLK has the same waveform (with the same transition timing or the like) on both of the chips C1 and C2.

Next, a configuration for selecting the signal generated from the signal MLCLK as the signal LCLK within the chip and selecting the signal generated from the signal LIOCLK as the signal LCLK within the chip will be described with reference to FIG. 3.

A description will be directed to a state where the DLL is in an activated state and an edge of the output signal MCLK of the output circuit replica circuit DL4 and a phase at a cross position of the differential clock signal CLK and CLKB are locked.

In this case, as described before, the delay control circuit DL2 outputs to the delay generation circuit DL1 the delay information signal DLT[t:1] which has been adjusted so that the edge of the output signal MCLK of the output circuit replica circuit DL4 and the phase at the cross position of the CLK and CLKB signals are locked. Based on this information, the delay generation circuit DL1 adds a delay to the input signal RCLK so that the edge of the signal MCLK and the phase at the cross position of the differential clock signal CLK and CLKB are locked, thereby generating the signal ETCLK.

In this locked state, the signal RLCLK becomes the clock signal earlier (with a phase thereof more advanced) than the signal MCLK by a time corresponding to a delay (an amount of which is indicated by "TREP") of the output circuit replica circuit DL4 having the same delay as the output circuits.

Then, based on the configuration example of the lock clock select circuit shown in FIGS. 3 and 4, via the two-input NAND circuit J3 and the clocked inverter J13 in FIG. 4, the signal ETCLK becomes the signal ELCLK signal (of which a delay from the signal ETCLK is indicated by "TEE"). This signal ELCLK is input to the lock clock select circuit as the signal MLCLK via the bonding wire connecting the dedicated pads DP in FIG. 3. As described before, this delay can be expressed as TSE+TW1+TSM.

Further, the signal MLCLK is connected to the signal RLCLK through the inverter J0, clocked inverter J10, two-input NAND circuit J7, and inverter J8 in FIG. 4.

A delay from the signal MLCLK and the signal RLCLK within the locked clock select circuit is indicated by TMR.

Via the two-input NAND circuit J2 and the clocked inverter J12 in FIG. 4, the signal ETCLK becomes the signal LIOCLK (of which a delay from the signal ETCLK is indicated by "TEL"). As described before, this signal LIOCLK is connected to an input/output terminal of the DLL circuit (input/output terminal of the locked clock select circuit DL3) that receives the signal LIOCLK of the DLL circuit on the chip C2 via the bonding wire connecting the dedicated pad DPIO on the chip C1 and the dedicated pad DPIO on the chip C2, and the dedicated pad DPIO on the chip C2. As described before, this delay becomes TSL+TW2+TSL.

Further, this signal LIOCLK is connected to the signal RLCLK through the inverter J1, clocked inverter J11, two-input NAND circuit J7, and inverter J8 in the locked clock select circuit in FIG. 4. A delay from the signal LIOCLK to the signal RLCLK in the locked clock select circuit is indicated by "TLR". With regards to respective values of the delays in FIG. 4 described before, the following equations hold because of the same configurations:

$$TEE=TEL \quad (4)$$

$$TMR=TLR \quad (5)$$

A delay (indicated by "TLL") from the signal LIOCLK to the signal LCLK when the signal OE that enables an output is High becomes equal to the delay TLR described before because of the same circuit configuration.

That is:

$$TMR=TLR=TLL \quad (6)$$

As described before, the second configuration example of the locked clock select circuit DL3 in FIG. 5 is configured by adding the replica delay element J15 of the wiring, pad, and bonding wire portions to the first configuration example in FIG. 4. The configuration in FIG. 5 is the configuration in which a delay equivalent of a delay of each of the signals ELCLK and MLCLK, dedicated pads DP, and bonding wire connecting the dedicated pads shown in FIGS. 2 and 3 is given by the capacitance formed of a transistor and the resistance element (and the delay of the element J15 is made to be equal to TSE+TW1+TSM).

With this arrangement, there is an advantage that the need for provision of the wires for the signals ELCLK and MLCLK, dedicated pads DP, and bonding wire connected to the dedicated pads DP is eliminated. However, it is necessary to adjust the equivalent delay elements in advance, based on information on a material of the bonding wire and a bonded length of the bonding wire.

An operation of the first configuration example of the lock clock select circuit in FIG. 4 based on delay relationships described above will be shown. The lock clock select circuit is on the chip C1 in FIG. 2 in which the DLL enable signal DLLEN is set to High and the flying lock clock LIOCLK is set to be supplied from the chip C1.

By the signal DLLEN at a High level and the signal DLLENB that is Low and indicates opposite data of the signal DLLEN, generated by the inverter J4, the input EN goes Low in the clocked inverter J11 and the input ENB goes High in the clocked inverter J11. Thus, the input signal LIOCLKB is not output as the signal SLCLK. The input EN goes High and the input ENB goes Low in the clocked inverter J10. Then, the input signal MLCLKB is output as the signal SLCLK of opposite data.

With respect to the signal SLCLK, the input signal DLLEN to the two-input NAND circuit J7 is High. Thus, the opposite data of the signal SLCLK is output as the signal RLCLKPB, and opposite data of the signal RLCLKPB is output through the inverter J8 as the signal RLCLK.

Likewise, in the two-input NAND circuit J5 to which the signal SLCLK is input, the opposite data of the signal SLCLK is output as the signal LCLKPB when the enable signal OE for enabling an output is High. Then, opposite data of the signal LCLKPB is output through the inverter J6 as the signal LCLK and input as the signal LCLK for the output circuits in FIG. 2.

When the signal OE is Low, the output LCLKPB of the two-input NAND circuit J5 goes High, and the output LCLK of the inverter J6 goes Low.

Since the input signal DLLEN is High, opposite data of the signal ETCLK is output from the two-input NAND circuit J3 as the signal ETCLKEB. In the clocked inverter J13, the input EN is High and the input ENB is Low. Thus, opposite data of the signal ETCLKEB is output as the signal ELCLK and is connected to the dedicated pad DP in FIG. 2.

The inverter J9 connected to the signal ELCLK is provided to apply the same load as a load caused by the inverter J1 connected to the signal LIOCLK.

The clocked inverter J14 does not output a GND level of an input because the input EN is Low and the input ENB is High. This clocked inverter J14 is an element provided to equalize a load of the signal LIOCLK caused by the clocked inverter J12 and a load of the signal MLCLK.

By the operation described above, a delay TDLE from the signal ETCLK to the signal RLCLK in FIG. 4 (which becomes the same as a delay from the signal ETCLK to the signal LCLK when the signal OE is High) on the chip C1 where the signal DLLEN is set to High can be expressed as the sum of:
(a) the delay (TEE) caused by the two-input NAND circuit J3 and the clocked inverter J13 in FIG. 4,
(b) the wiring delay (TSE) of the ELCLK signal,
(c) the delay (TW1) of the bonding wire connecting the dedicated pads DP,
(d) the wiring delay (TSM) of the MLCLK signal, and
(e) the delay (TMR) from the signal MLCLK to the signal RLCK through the inverter J0, clocked inverter J10, two-input NAND circuit J7, inverter J8 including a delay caused by a load of the clocked inverter J14 in FIG. 4, as follows:

$$TDLE=TEE+TSE+TW1+TSM+TMR \quad (7)$$

The delay of signal propagation from the signal ETCLK to the signal LCLK when the signal OE is High is the same as the delay of signal propagation from the signal ETCLK to the signal RLCLK.

Thus, the locked signal ETCLK on the chip C1 becomes the signal advanced more in time than the signal MCLK phase-synchronized with the external differential clock signal CLK and CLKB by TREP+TDLE.

Further, since the input EN is High and the input ENB is Low in the clocked inverter J12, the signal LIOCLK is output as the signal having the delay TEL with respect to the signal ETCLK.

Next, an operation of the first configuration example of the lock clock select circuit in FIG. 4 on the chip C2 in FIG. 2, where the DLL enable signal DLLEN is set to Low, and which is set so that the flying lock clock is supplied to the chip C2.

Since the signal DLLEN is Low, the output signal DLLENB of the inverter J4 goes High. In the clocked inverter J10, the input EN goes Low, and the input ENB goes High. Thus, the input signal MLCLKB is not output as the signal SLCLK. The input EN goes High and the input ENB goes Low in the clocked inverter J11. Thus, the input signal LIOCLKB is output as the signal SLCLK of opposite data.

Since the DLLEN signal supplied to the two-input AND circuit J7 is Low, the signal RLCLKPB that is High is output. The signal RLCLK, which is an output of the inverter J8 and Low, is output.

In the two-input NAND circuit J5 to which the signal SLCLK is input, the opposite data of the signal SLCLK is output as the signal LCLKPB when the enable signal OE for enabling an output is High. Then, through the inverter J6, opposite data of the signal LCLKPB is output as the signal LCLK by the inverter J6 and input as the signal LCLK for the output circuits in FIG. 2.

When the signal OE is Low, the output LCLKPB of the two-input NAND circuit J5 goes High, and the output LCLK of the inverter J6 goes Low.

Since the input DLLEN is Low, the output ETCLKEB of the two-input NAND circuit J3 goes High, and the signal ELCLK, which is the output of the clocked inverter J13, goes Low.

Since the signal ELCLK is input to the lock clock select signal in FIG. 4 as the signal MLCLK via the bonding wire connected to the dedicated pads DP, the ELCLK signal likewise goes Low.

Since the input signal DLLEN is Low, the output ETCLKLB of the two-input NAND circuit J2 goes High.

In the clocked inverter J12 to which the signal ETCLKLB is input, the input EN is Low and the input ENB is High. Thus, input data is not output, and the output signal LIOCLK becomes a high-impedance state.

The signal LIOCLK on the chip C1 where the signal DLLEN has been set to High is in an output state, and the signal LIOCLK is connected to the signal LIOCLK on the chip C2 via the bonding wire connecting the dedicated pad PIO of the chip C1 and the dedicated pad DPIO of the chip C2. Thus, the signal LIOCLK on the chip C2 is driven by the signal LIOCLK on the chip C1.

A delay TDLD from the signal ETCLK on the chip C1 in this state to the signal LCLK on the chip C2 can be expressed by the sum of:
(a) the delay (TEL) caused by the two input NAND circuit J2 and the clocked inverter J12 in FIG. 4 on the chip C1,
(b) wiring delay (TSL) of the signal LIOCLK,
(c) delay (TW2) caused by the loads of the bonding wire connecting the dedicated pad DPIO of the chip C1 and the dedicated pad DPIO of the chip C2 and the dedicated pads,
(d) wiring delay (TSL) of the signal LIOCLK on the chip C2, and
(e) delay (TLL) from the signal LIOCLK to the signal LCLK caused by the inverter J1, clocked inverter J11, two-input NAND circuit J5, and inverter J6, including a delay caused by a load of the clocked inverter J12 in FIG. 4 on the chip C2, as follows;

$$TDLD=TEL+TSL+TW2+TSL+TLL \quad (8)$$

From

TEE=TEL,

TSE=TSL,

TW1=TW2,

TSM=TSL,

TMR=TLL in the relational expressions described before, the delay TDLE (in Expression (7)) and the delay TDLD (in Expression (8)) become as follows:

$$TDLE=TDLD \quad (9)$$

It can be seen that the delays TDLE and TDLD are equal to each other.

Figure 6:
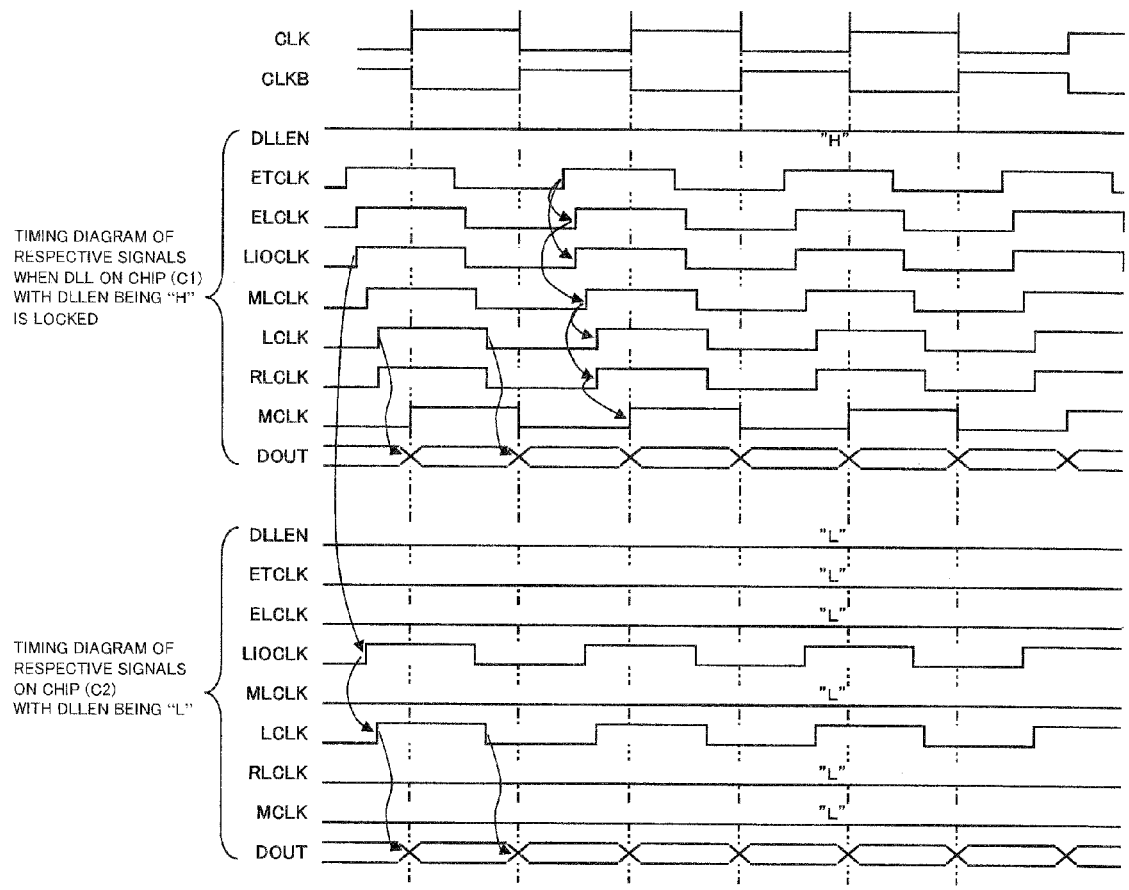
FIG. 6 is a timing diagram showing an operation of the first example of the present invention.

FIG. 6 is a timing diagram showing timing relationships described above in this example.

The timing diagram in FIG. 6 shows a case where the chip 1 is set so that the flying lock clock is supplied to other chip via the pad (or DLLEN is set to High) by the initial setting in accordance with the external command such as the mode register set command or using the signal obtained from the bonding option PDS provided separately, and the chip C2 is set so that the flying lock clock is captured from outside (or DLLEN is set to Low), FIG. 6 shows a case where the signal OE for enabling an output is High.

According to the timing diagram in FIG. 6 and the description described before, a data output timing of the chip C2 to which the flying lock clock has been supplied from the chip C1 becomes the same as that of the chip C1.

With regard to the operation of the DLL circuit on the chip C2 in this state, only a part of the lock clock select circuit DL3 in FIG. 3 operates. Accordingly, current consumption of the DLL circuit on the chip C2 can be greatly reduced.

In the first example, the chips C1 and C2 are in the same bonding connection relationship. Thus, DLL conditions of the chips C1 and C2 may be interchanged.

In a conventional configuration, DLL circuits mounted on respective semiconductor memory devices all operate. This holds true for a stacked module as well.

On contrast therewith, in a stacked or multi-chip module in this example, utilizing that a distance between the adjacent semiconductor memory devices is close, only the DLL of one of the semiconductor memory devices located in the vicinity with one another is operated, and the flying lock clock generated from the locked DLL circuit is supplied to the chip located in the vicinity. The number of activation of the DLL with respect to the number of the DLLs mounted on the semiconductor memory devices can be thereby reduced. Accordingly, current consumption of the entire module can be reduced.

Figure 7:
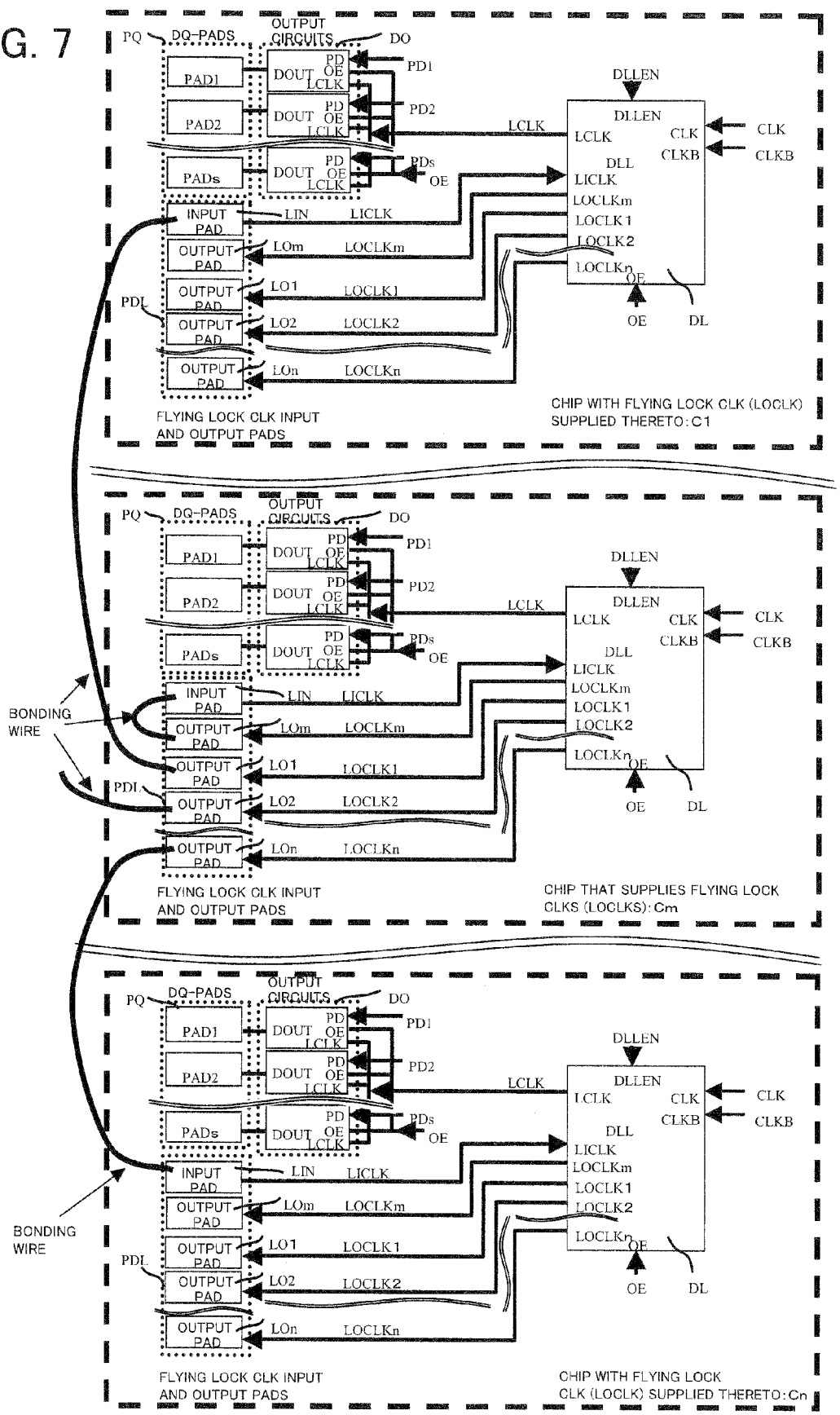
FIG. 7 is a diagram showing connection configurations between each of semiconductor memory devices and dedicated pads in a second example of the present invention.

FIG. 7 is a diagram showing a configuration of a second example of the present invention. FIG. 7 shows a connection configuration of n chips C1 to Cn (in which n is two or more) of semiconductor memory devices each including dedicated pads for inputting and outputting clock signals CLK generated from the locked clock signal CLK of a DLL and synchronized with the external differential clock signal CLK and CLKB, and a connection configuration from the DLL to outputs.

Each chip is configured to include in its inside a DLL circuit DL, output circuits DO, DQ-pads PQ, and flying lock clock input and output pads PDL. The DLL circuit has the differential clock signal CLK and CLKB input from outside, signal DLLEN which is an the activation signal of the DLL, signal OE for enabling output, signal LCLK generated from a signal phase-synchronized with the differential clock signal CLK and CLKB, signals LOCLK1 to LOCLKn (the flying lock clocks LOCLK1 to LOCLKn are referred to as "LOCLK signals" as well), and signal LICLK that is the signal input, having been generated from the locked clock of the DLL in other chip. Each of the output circuits DO receives the signal LCLK that is the CLK for output to the output circuits, generated from the signal phase-synchronized with the differential clock signal CLK and CLKB at the DLL circuit, signal OE for enabling output, and data signal PD for output. Output signals of the output circuits DO are connected to the DQ-pads PQ, respectively. The signals output from the output circuits DO are connected to the DQ-pads PQ, respectively. The flying lock clock input and output pads PDL are connected to the signals LOCLK of the flying lock clocks output from the DLL circuit DL and the signal LICLK input to the DLL circuit.

Each of chips C1 to Cm−1 and Cm+1 to Cn is set so that the flying lock clock is supplied thereto by the external command such as the MRS, and a chip Cm is set so that the flying lock clock is supplied to other chip by the external command such as the MRS (where n=m when n=2, and only the chip C1 is present in the semiconductor memory device, m=2 when n=3, and m<=n−1 when n>=4).

Connection between the chips in this case is made by connection of a pad Lou (in which u is one of integers from 1 to m) dedicated for output in the chip Cm to a pad LIN dedicated for input in a corresponding chip by a bonding wire.

When u=m, bonding is made on the same chip.

Figure 8:
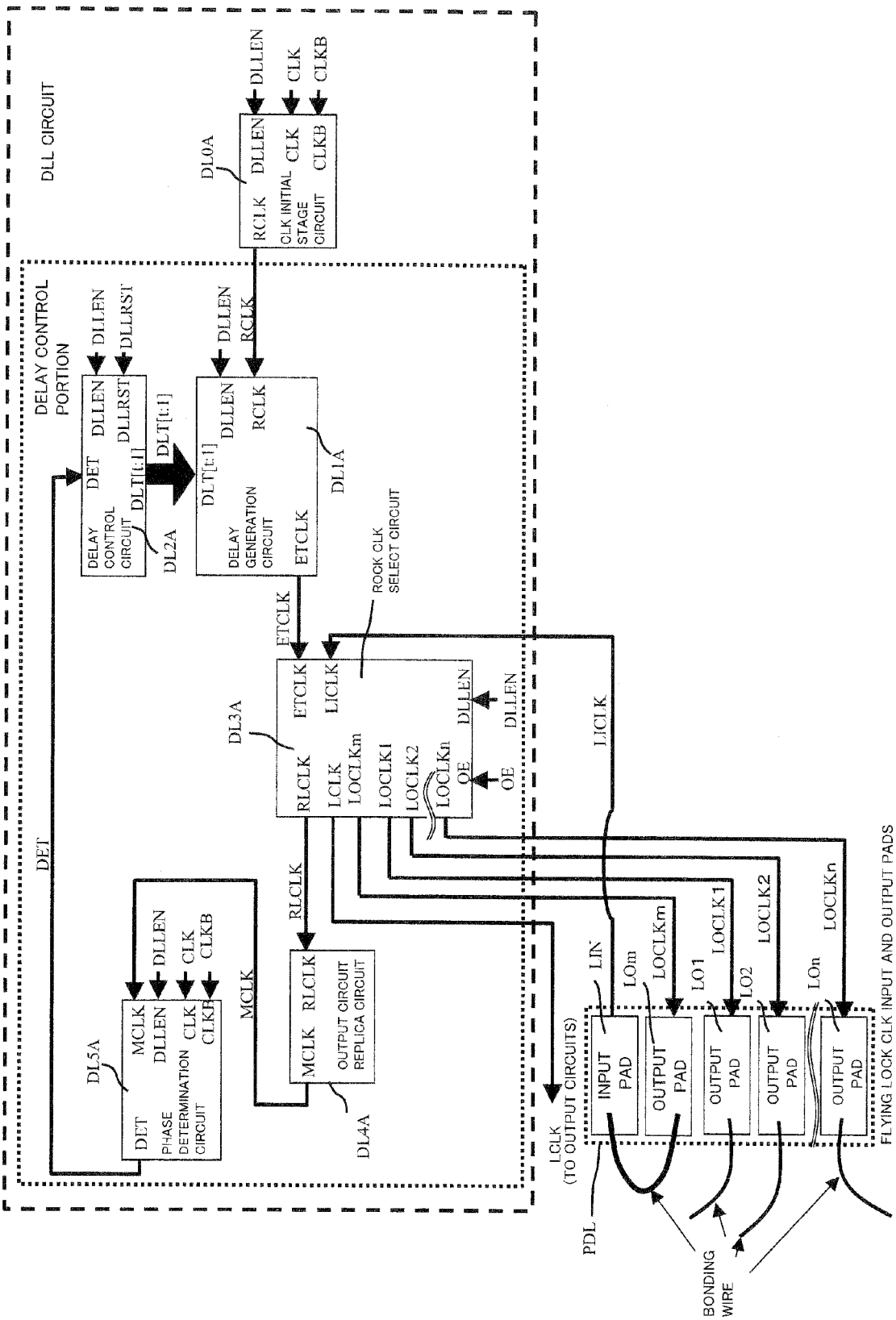
FIG. 8 is a diagram showing a configuration of a DLL circuit in the second example of the present invention and a connecting relationship between the DLL circuit and each of the dedicated pads.

FIG. 8 shows a diagram showing a configuration of the DLL circuit in the second example of the present invention and connecting relationships between the pads and the DLL circuit.

A configuration difference between FIG. 8 and FIG. 3 (which are the diagram each showing the configuration of the DLL circuit and the connecting relationships between the pads and the DLL circuit) is that lock clock selector circuit DL3A is provided in place of the lock clock selector circuit DL3 in FIG. 3 and that the flying lock clock input and output pads are provided in FIG. 8 in place of the dedicated pads (DP, DPIO) in FIG. 3.

Wire connection information in FIG. 8 is different from wire connection information in FIG. 3 in following two respects (A) and (B).

(A) The flying lock clocks (LOCLK signals) output from the lock clock selector circuit DL3A, the number of which corresponds to the number of chips that respectively share a corresponding one of the flying lock clocks generated from the clock signal locked by the DLL circuit, are output. The flying lock clocks are connected to the flying lock clock input and output pads Lou, respectively.

(B) Referring to FIG. 3, the signal ELCLK is input to the DLL circuit as the signal MLCLK via the bonding wire connecting the dedicated pads DP. Referring to FIG. 8, the signal LOCLKm on the chip Cm set to supply the flying lock clock is input to the DLL as the signal LICLK via the bonding wire connecting the output pad LOm and the input pad LIN.

Figure 9:
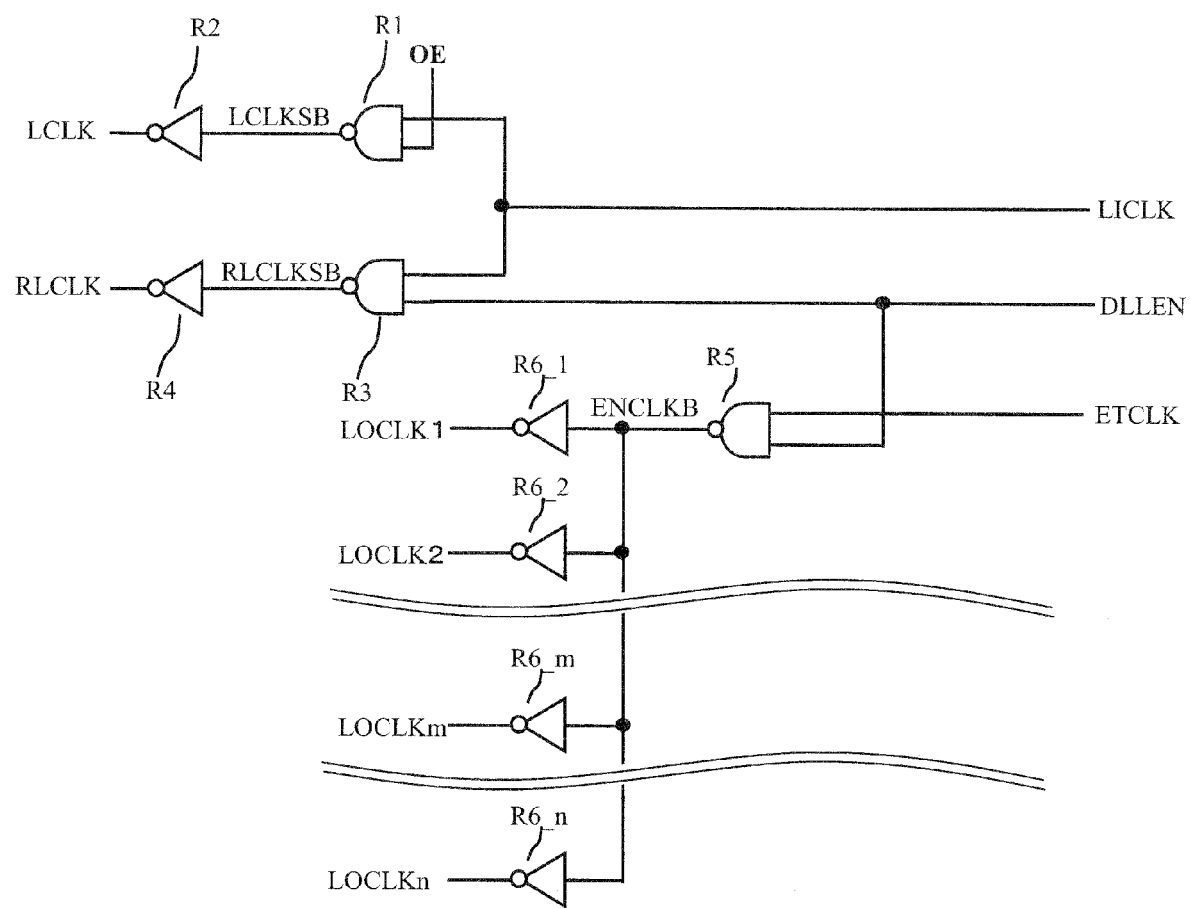
FIG. 9 is a diagram showing a configuration example of a lock clock select circuit in the second example of the present invention.

FIG. 9 is a diagram showing an example of a configuration of the lock clock select circuit DL3A in FIG. 8. The configuration in FIG. 9 includes:

a two-input NAND circuit R1 that receives the signals LICLK and OE and outputs a signal LCLKSB, an inverter R2 that receives the signal LCLKSB and outputs the signal LCLK, a two-input NAND circuit R3 that receives the signals LICLK and DLLEN and outputs a signal RLCLKSB, an inverter R4 that receives the signal RLCLKSB and outputs the signal RLCLK, a two-input NAND circuit R5 that receives the signals DLLEN and ETCLK and outputs a signal ENCLKB, and inverters R6_1 to R6_n that receives the signal ENCLKB and outputs the signals LOCLK.

Next, an operation of the second example of the present invention will be described. The chip Cm in FIG. 7 is set to supply the flying lock clock to other chips C1 to Cm−1 and other chips Cm+1 to Cn via the PADs and the bonding wires, according to the external command such as the MRS, and the DLL of the chip Cm is then activated (or the signal DLLEN goes High).

The chips C1 to Cm−1 and the chips Cm+1 to Cn are set to have the flying lock clock to be supplied thereto from the chip Cm via the pads and the bonding wires, and the DLL of each of the chips C1 to Cm−1 and the chips Cm+1 to Cn is deactivated (or the signal DLLEN goes Low).

When the DLL on the chip Cm is locked in this state, an edge of the signal MCLK becomes synchronized with the phase at a cross position between the external input signal CLK and CLKB, according to the configuration of the DLL circuit on the chip Cm shown in FIG. 8. For this reason, the signal RLCLK becomes the signal advanced more in time than the signal MCLK by a time corresponding to the delay (TREP) of the output circuit replica circuit DL4A.

In the DLL circuit on the chip Cm, the signal DLLEN is High. Thus, the signal ETCLK input to the locked clock select circuit DL3A becomes the signal advanced more than the signal RLCLK by a time corresponding to the sum of:

(a) a delay caused by the two-input NAND circuit R5 and the inverter R6_m in FIG. 9, which is the delay from the signal ETCLK to the signal LOCLKm (an amount of which being indicated by "TELm"), (b) a wiring delay (TSLOm) of the signal LOCLKm in FIG. 8, (c) a delay (an amount of which is indicated by "TBm") caused by loads of the bonding wire that connects the output pad LOm to which the signal LOCLKm is connected and the input pad LIN, the output pad LOm, and input pad LIN, (d) a wiring delay (TSLIm) of the signal LICLK connected to the input pad LIN, and (e) a delay (an amount of which is referred to as "TLRm") from the signal LICLK to RLCLK, caused by the two-input NAND circuit R3 and the inverter R4 in FIG. 9. That is, the signal ETCLK becomes the signal advanced more than the signal RLCLK by:

$$TDLEm = TELm + TSLOm + TBm + TSLIm + TLRm \quad (10)$$

A delay from input of the signal ETCLK to the signal LCLK (output of the lock clock select circuit DL3A) on the chip Cm becomes TDLEm.

When the signal OE that enables output is High, the two-input NAND circuit R1 on a path from the signal LICLK to the signal LCLK is enabled. Thus, a delay (TLLm) caused by the two-input NAND circuit R1 and the inverter R2 becomes the same because of the same configuration for the delay TLRm.

$$TLLm = TLRm \quad (11)$$

That is, the delay from the signal ETCLK to the signal LCLK also becomes TDLEm.

On the other hand, a delay TDLDu in output of the signal LCLK on a chip Cu (in which u is one of positive integers from 1 to m−1, m+1 to n) of the chips C1 to Cm−1 and the chips Cm+1 to Cn set to have the signal LOCLK, which is the flying lock clock generated from the signal ETCLK signal on the chip Cm, to be supplied thereto is given as the sum of:

(a) a delay (TELu) caused by the two-input NAND circuit R5 and the inverter R6_u on the lock clock select circuit on the chip Cm in FIG. 9, (b) a delay (TSLOu) to one of the flying lock clock input and output pads PDL to which the signals LOCLK are connected, (c) a delay (an amount of which is indicated by "TBu") caused by loads of the bonding wire connecting an output pad Lou of the flying lock clock input and output pads and the input pad LIN of the flying lock clock input and output pads on the chip Cu, the output pad Lou, and the input pad LIN, (d) a wiring delay (TSLIu) of the signal LICLK on the chip Cu in FIG. 7, and (e) a delay (TLLu) caused by the two-input NAND circuit R1 and the inverter R2 in FIG. 9, and can be expressed as follows:

$$TDLDu=TELu+TSLOu+TBu+TSLIu+TLLu \quad (12)$$

The value of the delay TELk (where k is one of integers from one to n) becomes the same because of the same configuration.

Further, wiring is made so that the signals LOCLK and the signal LICLK have the same wiring delay. The delay TSLOk (where k is the one of integers from one to n) is made to be the same as the delay TSLIk (where k is the one of integers from one to n).

The delay TBk (where k is the one of integers from one to n) is made to be the same by carrying out bonding so that a bonding delay becomes equal.

The delay TLLk caused by the two-input NAND circuit R1 and the inverter R2 in FIG. 9 (where k is the one of integers from one to n) is the same because of the same configuration. Further, as described before, TLLk=TLRk.

From the foregoing conditions, the following equation holds:

$$TDLEm=TDLDk \quad (13)$$

(where k is one of integers from 1 to m−1 and from m+1 to n)

Then, timings of the signals LCLK on the respective chips may be made to be the same.

The DLL circuit is active on only one chip among n chips in this example. Power consumption of this chip increases because the flying lock clock generated from the locked clock is supplied to other chips.

On the other hand, the DLL circuits on the other chips are not active. Since only a part of the lock clock select circuit operates in each of the DLL circuits. Thus, power consumption of the other chips can be greatly reduced.

From a ratio of a circuit of operation, it can be easily estimated that a reduction of power consumption is greater than an increase in the power consumption. Thus, according to the configuration in this example, current consumption of the DLLs on an entire module can be greatly reduced.

Since the second example is different from the first example in terms of a bonding configuration. Accordingly, interchange between a chip from which the flying lock clock is supplied and a chip to which the flying lock clock is supplied cannot be made, after bonding.

The present invention can be applied to a semiconductor device such as a DRAM (Dynamic RAM), an SRAM (Static RAM), and the like, all of which includes a DLL.

The foregoing description was made in connection with the examples described above. The present invention is not limited to the configurations of the examples described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a DLL (Delay Lock Loop) circuit; and
a circuit unit that in a first state, supplies to at least one other semiconductor memory device a clock signal (referred to as a "flying lock clock signal") which is generated from a locked clock in the DLL circuit and is delay-synchronized with an external clock signal supplied to the semiconductor memory device and that in a second state, deactivates the DLL circuit and generates an output signal of the DLL circuit from the flying lock clock signal supplied from another semiconductor memory device.

2. The semiconductor memory device according to claim 1, wherein
the DLL circuit comprises:
a lock clock select circuit that selects one of a signal delay-synchronized with the external clock signal externally supplied to the semiconductor memory device and the flying lock clock signal supplied from the DLL circuit of the other semiconductor memory device;
a phase detection circuit that receives a clock signal from said lock clock select circuit directly or through a replica circuit of an output circuit, and detects a phase difference between the clock signal and the external clock signal;
a delay control circuit that receives an output of said phase detection circuit and generates a signal that controls a delay time; and
a delay generation circuit that changes a delay of the external clock signal according to a signal output from said delay control circuit.

3. A semiconductor memory device comprising:
a first semiconductor memory device including a first DLL circuit; and
a second semiconductor memory device including a second DLL circuit, the first semiconductor memory device supplying an output signal of the first DLL circuit to the second semiconductor memory device, and
the second semiconductor memory device deactivating the second DLL circuit thereof and generating an output signal of the second DLL circuit from the output signal supplied from the first semiconductor memory device.

4. A semiconductor memory device comprising:
a DLL (Delay Lock Loop) circuit; and
a pad that supplies to at least one other semiconductor memory device a clock signal (referred to as a "flying lock clock signal") which is generated from a locked clock in the DLL circuit and which is delay-synchronized with an external clock signal supplied to the semiconductor memory device, or receives a flying lock clock signal which is generated from a locked clock in a DLL circuit of other semiconductor memory device and supplied from the other semiconductor memory device and which is delay-synchronized with the external clock signal, wherein, when the semiconductor memory device is supplied with the flying lock clock signal from the other semiconductor memory device, the semiconductor memory device exercises control so as to deactivate the DLL circuit and to generate an output signal of the DLL circuit from the flying lock clock signal received at the pad.

5. The semiconductor memory device according to claim 4, wherein the deactivation of the DLL circuit is carried out by deactivating a delay lock loop in the DLL circuit.

6. The semiconductor memory device according to claim 4, wherein selection is made between
- a state where the flying lock clock signal is supplied to the other semiconductor memory device via a pad of the other semiconductor memory device connected to said pad by a bonding wire; and
- a state where the flying lock clock signal is received from the DLL circuit of the other semiconductor memory device via said pad connected to a pad of the other semiconductor memory device by a bonding wire.

7. The semiconductor memory device according to claim 4, wherein information on a delay caused by connection via pads connecting the semiconductor memory device and the other semiconductor memory device is obtained by a replica including resistors and capacitors, and a clock signal advanced with respect to the lock clock signal in the DLL circuit by said delay is supplied to the other semiconductor memory device as the flying lock clock signal.

8. The semiconductor memory device according to claim 4, wherein
the DLL circuit generates and outputs other clock signal (ELCLK) delay-synchronized with the external clock signal from an output terminal thereof, the other clock signal (ELCLK) output from the DLL circuit being supplied to one pad and then supplied to a first input terminal (MLCLK) of the DLL circuit from other pad connected to the one pad by a bonding wire; and
the DLL circuit receives the flying lock clock signal supplied from the other semiconductor memory device at a second input/output terminal (LIOCLK) of the DLL circuit through said pad via a wire, or outputs the flying lock clock signal generated at the DLL circuit and delay-synchronized with the external clock signal to said pad via said wire; and wherein
the DLL circuit comprises:
a lock clock select circuit that receives a DLL control signal which controls activation/deactivation of the DLL circuit,
selects a clock signal supplied to said first terminal for output as a lock signal (LCLK) from the DLL circuit and outputs the flying lock clock signal delay-synchronized with the external clock signal to said pad from said second terminal of the DLL circuit, when the DLL control signal is activated, and
causes an output of said second terminal to be set in a high-impedance state and selects the flying lock clock signal supplied to said second terminal from said pad for receiving the flying lock clock signal, for output as the lock signal (LCLK) from the DLL circuit, when the DLL control signal is deactivated.

9. The semiconductor memory device according to claim 8, wherein
a delay time as from output of the other clock signal (ELCLK) delay-synchronized with the external clock signal from the DLL circuit, the other clock signal (ELCLK) reaching the one pad via a wire and propagating from the one pad to other pad connected to the one pad by the bonding wire, to input of the other clock signal (ELCLK) to said first terminal (MLCLK) of the DLL circuit via a wire, is made equal to
a delay time as from output of the flying lock clock signal delay-synchronized with the external clock signal from said second terminal (LIOCLK) of the DLL circuit, the flying lock clock signal reaching a pad of the other semiconductor device via a wire, said pad, and a bonding wire, to input of the flying lock clock signal to a second terminal (LIOCLK) of the other semiconductor device via a wire.

10. The semiconductor memory device according to claim 8, further comprising
a delay generation circuit that variably delays the external clock signal to produce a basic signal (ETCLK),
wherein in the lock clock select circuit,
a delay time from input of the basic signal (ETCLK) output from the delay generation circuit and delay-synchronized with the external clock signal to said lock clock select circuit to output of the lock signal (LCLK) of the DLL circuit is made equal to a delay time from input of the basic signal (ETCLK) output from the delay generation circuit and delay-synchronized with the external clock signal to said lock clock select circuit to output of a lock signal (LCLK) of the DLL circuit of the other semiconductor device with the DLL control signal thereof being deactivated.

11. The semiconductor memory device according to claim 8, comprising:
a replica delay element of wire, pad, and bonding wire portions that replicates a delay from output of the other clock signal (ELCLK) from the DLL circuit to input to a first terminal (MLCLK) of the DLL circuit from one pad via other pad connected to the other pad by a bonding wire.

12. The semiconductor memory device according to claim 8, further comprising
a delay generation circuit that variably delays an external clock signal to produce a basic signal (ETCLK), wherein
the DLL circuit receives a clock signal at an input terminal (LICLK) of the DLL circuit via the pad for a clock signal to be supplied to the other semiconductor memory device and delay-synchronized with the external clock signal and other pad connected to said pad by a bonding wire and outputs the clock signal as a lock signal (LCLK) from the DLL circuit, and wherein
in the lock clock select circuit,
a delay time from input of the basic signal (ETCLK) output from the delay generation circuit and delay-synchronized with the external clock signal to the lock clock select circuit of the DLL circuit to output of the lock signal (LCLK) of the DLL circuit is made equal to a delay from input of the basic signal (ETCLK) output from the delay generation circuit and delay-synchronized with the external clock signal to said lock clock select circuit to output of a lock signal (LCLK) of the other semiconductor device, with a DLL control signal thereof being deactivated.

13. A semiconductor device including a stacked module of semiconductor memory devices each including a DLL (Delay Lock Loop) circuit that delay synchronizes a clock signal or a multichip module including a plurality of semiconductor memory devices each including a DLL, wherein
a DLL circuit in one of the semiconductor memory devices is activated and a locked clock signal (referred to as a "flying lock clock signal") generated from the DLL circuit and delay-synchronized with an external clock signal is supplied to at least one of the other semiconductor memory devices with the DLL circuit thereof deactivated, thereby allowing reduction of a number of activation of the DLL circuits with respect to a number of the mounted semiconductor memory devices and reduction of current consumption of the entire module.

14. The semiconductor device according to claim 13, wherein
- a dedicated pad for the DLL circuit for sharing the flying lock clock signal between one of the semiconductor memory devices and the other of the semiconductor memory devices is provided;
- the DLL circuit of the one semiconductor memory device is selectively activated;
- the DLL circuit of the other semiconductor memory device is selectively deactivated;
- the flying lock clock signal generated at the DLL circuit is output from the pad of the one semiconductor memory device; and
- the other semiconductor memory device receives the flying lock clock signal from the pad, and the deactivated DLL circuit of the other semiconductor memory device supplies the received flying lock clock signal to an inside of the other semiconductor memory device as a lock signal.

15. The semiconductor device according to claim 14, wherein
- the DLL circuit outputs other clock signal (ELCLK) delay-synchronized with the external clock signal from the DLL circuit, the other clock signal (ELCLK) being supplied to one pad and then supplied to a first input terminal (MLCLK) of the DLL circuit from other pad connected to the one pad by a bonding wire; and
- the DLL circuit receives the flying lock clock signal supplied from the other semiconductor memory device at a second input/output terminal (LIOCLK) of the DLL circuit through the pad via a wire, or outputs the flying lock clock signal generated at the DLL circuit and delay-synchronized with the external clock signal to the pad via the wire; and wherein
- the DLL circuit comprises:
- a lock clock select circuit that receives a DLL control signal which controls activation/deactivation of the DLL circuit,
- selects a clock signal supplied to said first terminal, for output as a lock signal (LCLK) from the DLL circuit and outputs the flying lock clock signal delay-synchronized with the external clock signal to the pad from said second terminal of the DLL circuit, when the DLL control signal is activated, and
- causes an output of said second terminal to be in a high-impedance state and selects the flying lock clock signal supplied to said second terminal, for output as the lock signal (LCLK) from the DLL circuit, when the DLL control signal is deactivated.

16. The semiconductor device according to claim 15, wherein
- a delay time from output of the other clock signal (ELCLK) delay-synchronized with the external clock signal from the DLL circuit, the other clock signal (ELCLK) reaching the one pad via a wire and propagating from the one pad to other pad connected to the one pad by the bonding wire, to input of the other clock signal (ELCLK) to said first terminal (MLCLK) of the DLL circuit via a wire, is made equal to a delay time from output of the flying lock clock signal delay-synchronized with the external clock signal from said second terminal (LIOCLK) of the DLL circuit, the flying lock clock signal reaching a pad of the other semiconductor device via a wire, said pad, and a bonding wire, to input of the flying lock clock signal to a second terminal (LIOCLK) of the other semiconductor device via a wire.

17. The semiconductor device according to claim 16, further comprising
- a delay generation circuit that variably delays an external clock signal to produce a basic signal (ELCLK), wherein
- in the lock clock select circuit in the DLL circuit,
- a delay time from input of the basic signal (ELCLK) output from the delay generation circuit and delay-synchronized with the external clock signal to said lock clock select circuit to output of the lock signal (LCLK) of the DLL circuit is made equal to a delay time from input of the basic signal (ETCLK) being output from the delay generation circuit and being delay synchronized with the external clock signal to said lock clock select circuit to output of a lock signal (LCLK) of the DLL circuit of the other semiconductor device when the DLL control signal is deactivated.

18. The semiconductor device according to claim 15, comprising:
- a replica delay element of wire, pad, and bonding wire portions that replicates a delay from output of the other clock signal (ELCLK) from the DLL circuit to input to a first terminal (MLCLK) of the DLL circuit from one pad via other pad connected to the other pad by a bonding wire.

19. The semiconductor device according to claim 15, further comprising:
- a delay generation circuit that variably delays the external clock signal to produce a basic signal (ETCLK), wherein
- the DLL circuit receives a clock signal at an input terminal (LICLK) of the DLL circuit via a pad for a clock signal to be supplied to the other semiconductor memory device and delay-synchronized with the external clock signal and other pad connected to the pad by a bonding wire, and outputs the flying lock clock signal as a lock signal (LCLK) from the DLL circuit; and wherein
- in the lock clock select circuit in the DLL circuit,
- a delay time from input of the basic signal (ETCLK) output from the delay generation circuit and delay-synchronized with the external clock signal to the lock clock select circuit of the DLL circuit to output of a lock signal (LCLK) of the DLL circuit is made equal to a delay from input of the basic signal (ETCLK) being output from the delay generation circuit and being delay-synchronized with the external clock signal to said lock clock select circuit to output of a lock signal (LCLK) of the other semiconductor device when a DLL control signal is deactivated.

* * * * *